Oct. 30, 1962 HATSUAKI FUKUI ETAL 3,061,743

BINARY CIRCUIT

Filed Feb. 7, 1961

Inventors
Hatsuaki Fukui
Keiji Tsujii by Hill, Sherman, Meroni, Gross & Simpson Attys.

3,061,743
BINARY CIRCUIT

Hatsuaki Fukui, Tokyo, and Keiji Tsujii, Sagami-shi, Kanagawa-ken, Japan, assignors to Sony Corporation, Shinagawa-ku, Tokyo, Japan, a corporation of Japan Filed Feb. 7, 1961, Ser. No. 87,561
Claims priority, application Japan Feb. 10, 1960
8 Claims. (Cl. 307—88.5)

This invention relates to a binary circuit or binary scaler using a bistable, negative resistance device and more particularly to a simple binary circuit requiring only one such negative resistance device which is preferably an Esaki diode.

The principal objects of this invention are to provide a binary circuit which is simple, has few connections, and is always accurate and reliable in its operations under a wide range of operating conditions.

Other objects, features and advantages of this invention will be apparent from the following description, taken in connection with the accompanying drawings, in which.

Figures 3A, 3B, 3C, 3D:
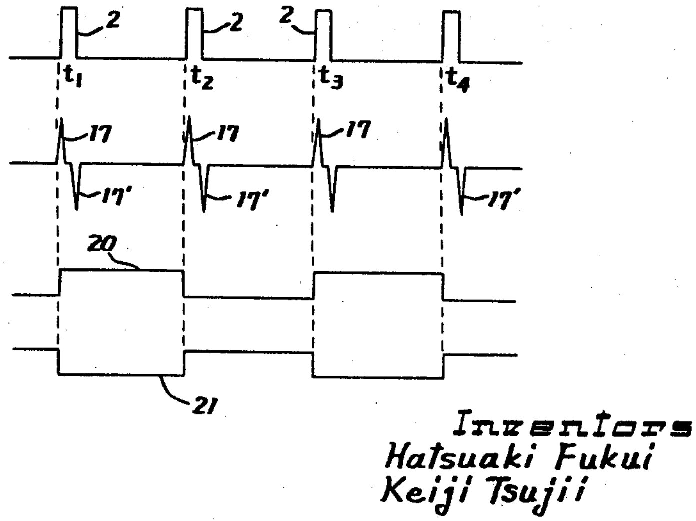
FIGURE 3A shows a series of control pulses supplied by the source S.
FIGURE 3B shows the same pulses after they have been differentiated.
FIGURE 3C shows the square type wave or binary scale output from output terminal 18 with respect to ground.
FIGURE 3D shows the similar but inverted or opposite polarity output from terminal 19 with respect to ground.

Any desired or suitable succession or one or more series of controlling pulses are supplied in any desired or conventional manner from the schematically illustrated, pulse signal source S to the single or common input signal terminal 1. As hereinafter disclosed, for purposes to be explained hereinafter, this signal source S may supply a plurality or two sets of successive alternate signals. However, in the immediately following description the successive signal pulses 2 of FIGURE 3A are considered as being of one set or from one source.

According to this invention, the switching controlling or the bistable circuit need have only one, negative resistance device which is, preferably a diode and also preferably of the voltage controlled type. More particularly, as is illustrated in our exemplary embodiment herein, the negative resistance device D is an Esaki diode, often called a tunnel diode. It has an N type characteristic as shown by its characteristic 7 in FIGURE 2.

Figure 1:
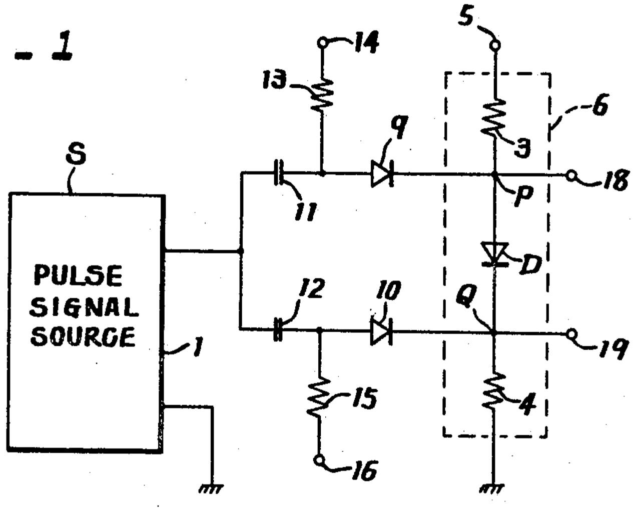
FIGURE 1 is a circuit diagram illustrating one example of a binary circuit according to this invention.

As shown in FIGURE 1, the two bias and load resistances 3 and 4 are connected in series with, and on each side of, the negative resistance or tunnel diode D. Thus, these two resistances are connected as shown in the order of the suitable bias voltage source 5, resistor 3, diode D. resistor 4, and the ground or return path to form a bistable circuit 6.

Figure 2:
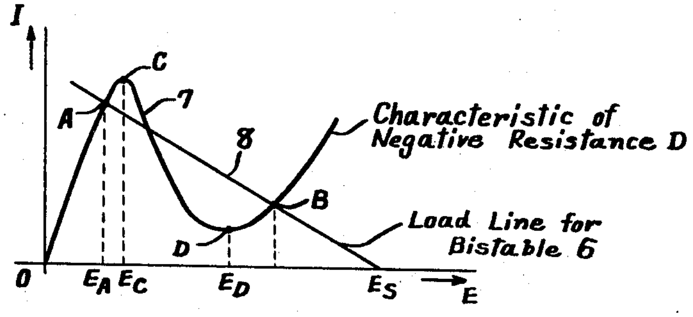
FIGURE 2 shows a characteristic of an Esaki diode employed in this invention together with a load line for a bistable or switching type of circuit including the same diode.

The resistors 3 and 4 are loads for the diode D in its bistable circuit 6 to provide a load curve or load line 8 of the type shown in FIGURE 2 and thus provide the desired bistable type of circuit as will be well understood by those skilled in this art. The points at which the load line 8 intersects the first and second positive resistance portions (or increasing current portions) of the tunnel diode characteristic 7 are the two stable points A and B as shown. The voltage of the bias source 5 or the voltage drop through the bistable circuit 6 is indicated by $E_s$ in FIGURE 2.

As well understood by those skilled in this art, when this bistable circuit 6 is stable at point A, the application of a voltage large enough to get over the maximum point C of the characteristic 7 (that is, added voltage which is a little higher than bias voltage $E_c$, corresponding to the point C) will shift the stable point or condition immediately from A to B. When the diode D is stable at the point B, the application of a negative voltage large enough to go under or beyond the minimum point D (namely, the voltage which is a little lower than the bias voltage $E_d$, corresponding to the point D) moves the stable point from B to A.

As shown in FIGURE 1, two one-directional devices 9 and 10 are connected to the bistable circuit 6. These devices 9 and 10 are preferably diodes and are preferably voltage controlled. In our exemplary embodiment, they are suitable, conventional rectifier diodes. As will be well understood by those skilled in this art from this description, various types of primarily or predominantly one-directional devices may be employed for this purpose since it is not essential that there be a complete cut-off of the negative or backward currents when these devices 9 and 10 are in their off condition.

As shown in FIGURE 1, these one-directional diodes or rectifiers 9 and 10 are connected to the positive and negative electrodes P and Q respectively of the negative resistance diode D through capacitors 11 and 12 respectively from the controlling pulse or signal supply source S.

As will be understood by those skilled in this art that and within the broader purview of this invention, the controlling signals may be supplied to rectifiers 9 and 10 in various ways, including separate connections from separate sources. However, as illustrated in our exemplary embodiment the controlling pulses or signals are all received at the single or common input terminal 1. These pulses, shown in the time versus amplitude of voltage or current curve of FIGURE 3A, are preferably (but not necessarily in all cases) differentiated by the capacitors 11 and 12, into the steep positive and negative, voltage versus time impulse pairs 17 and 17′ of FIGURE 3B.

According to this invention, a first power and voltage source 14 also supplies a bias voltage through a suitable resistor 13 to the positive electrode of the diode or rectifier 9. This bias voltage may be the same, or a little lower than, the electrical potential or voltage of the point P when the diode D is at its stable point A. Thus, the voltage controlled, rectifier or one-directional device 9 will be made conductive by the additional positive voltage of the pulse 2 (as shown in FIGURE 3A) from the input terminal 1. When the differentiating capacitors 11 and 12 are used and in accordance with the exemplary embodiment of our invention, the initial or positive pulse 17 of the pulse pair 17—17′ (which corresponds to the front or rising current or voltage portion of the signal pulse 2) similarly serves to trigger or control the conductivity of the rectifier 9 to make it conductive.

In similar fashion, the second electrical power source 16 also delivers a positive biasing voltage through suitable resistor 15 to the positive electrode of the one-directional device or rectifier 10. In like fashion, this biasing voltage may be the same or a little lower than the voltage or electrical potential of the point Q when the diode is at its stable point B. In like manner, the rectifier 10 is made conductive by the positive voltage pulse 2 from the input terminal 1, or the positive portion 17 of the pulse pair 17—17′, when negative resistance diode D is at its stable point B. With the above described stable points A and B, the electric potentials at the point Q have a relationship under which $E_{QA}$ is always greater than $E_{QB}$ where $E_{QA}$ and $E_{QB}$ are the electrical potentials of the point Q for the two stable conditions A and B respectively. Similarly, the electric potentials at point P have the relationship under which $E_{PA}$ is always less than $E_{PB}$ where $E_{PA}$ and $E_{PB}$ are the potentials of the point P for the two stable conditions A and B respectively.

In accordance with the exemplary embodiment of this invention, when an impulse such as one of the controlling signal pulses 2 as shown in FIGURE 3A is supplied to the input terminal 1, this input pulse signal 2 (which may be of the square wave type) is differentiated by the capacitor 11 and the resistor 13 to give the positive differentiated pulse 17 (of FIGURE 3B) which is supplied to the rectifier 9. At the same time, this same input pulse signal 2 is similarly differentiated by the capacitor 12 and the resistor 15 and then supplied to the rectifier 10.

When the negative resistance diode of bistable circuit 6 is at its stable point A, rectifier 9 is easily made conductive by this differentiated pulse 17 since the electrical potentials at the positive and negative terminals or electrodes of rectifier diode 9 are close to, or almost equal to, each other. On the other hand, when the negative resistance diode D of the bistable circuit 6 is at its other stable point B, the electrical potential of the negative electrode of the rectifier 10 is so much higher than that of the positive electrode of rectifier 10 that this rectifier 10 is not made conductive by the positive, input pulse signal 17. It will be understood that the amplitudes of pulses 2 or the corresponding, differentiated pulse signals 17, are always less than the additional positive voltage necessary to shift the stable point of the bistable circuit 6 for both of its stable conditions.

Accordingly, it will be apparent that when the bistable circuit 6 is at its stable point A, the next or first positive or plus voltage pulse signal (such as pulse signal 17 of FIGURE 3B) will make rectifier 9 conductive and raise the electric potential of point P to trigger the negative resistance diode D in its bistable circuit to shift this bistable circuit 6 to its other stable point B.

Thus, the current and the corresponding voltage, delivered at output terminal 18 from point P will shift in an on-off or up and down fashion as shown by the corresponding output curve 20 of FIGURE 3C. In like manner, the output at the output terminal 19 from the point Q will shift according to the output curve 21 of FIGURE 3D. It is to be noted that the on-off or up-down shifts for curves 20 and 21 respectively are in opposite directions or in opposition. It will also be noted that the shifts at terminal 18 for curve 3C and at terminal 19 for curve FIGURE 3D will occur at the same time intervals $t_1$, $t_2$, $t_3$, $t_4$, etc. as shown in FIGURE 3A for the controlling signal pulses. It will be understood that the intervals between these pulses, and the intervals between the corresponding shifts of output curves 20 and 21 respectively, need not be uniform.

Continuing with the description of the operation of this circuit, with the bistable circuit 6 at its stable point B, the rectifier 10 will be made conductive by the next positive input pulse (such as 2 or 17) while the rectifier 9 will remain non-conductive. Thus, in this case, the input pulse signal 17 is delivered by rectifier 10 to the lower electrical potential point Q to thus raise its potential temporarily by the amount of the plus input pulse signal 17. This temporary increasing of the potential at point Q reduces the voltage effective across the negative resistance diode D to thereby trigger or shift it from its stable point B to its stable point A. Ordinarily, the first on, higher output interval, or square wave portion 20 of curve 3C for terminal 18 and which had a duration or interval of $t_1$ to $t_2$ is turned off to produce the beginning of the next off or lower output interval $t_2$ to $t_3$. As noted above, the output curve 21 for square type waves shown in FIGURE 3D for the terminal 19 is the same except that the shifts are oppositely directed so that its on portions correspond to the off portions for FIGURE 3C and terminal 18.

Thus the output terminals 18 and 19 may be considered as being of reverse polarity or of reverse directions at their shifts to give a binary scale type output between each of these output terminals 18 and 19 and the ground or earth. This same type binary scale or square type wave output or signal may also be picked up between the two output terminals 18 and 19 to give greater shift amplitudes.

It will be apparent that the invention of our exemplary embodiment may be usefully employed for various purposes when the input pulses or signals (such as the pulses 2 of FIGURE 3A when supplied by signal source S) are all part of one set or wave or are all from a single source, in accordance with the foregoing description of the operation of this invention. However, in accordance with the above description and as indicated in FIGURE 1, successive ones of the individual, controlling pulses (such as 2 of FIGURE 3A) may be supplied from a plurality of, or two different sources or may belong to a plurality, or two different sets or series of successively and alternately applied input signal pulses. Thus, and as an example, the controlling signal pulses at $t_1$, $t_3$ and $t_5$ (or the odd numbered pulses) may be from one source, form part of one wave set or series, and be individually phase modulated to carry a first message, signal, or intelligence. The controlling signal pulses at $t_2$, $t_4$ and $t_6$ (or the even numbered pulses according to this example) may similarly form part of a second or entirely different wave, set, or series of impulses which are differently phase or time modulated to convey a different message, intelligence, or signal. Thus, both the square type wave output 20 of FIGURE 3C for output terminal 18 and, similarly, the reversed, square type wave 21 of FIGURE 3D for terminal 19 (or the greater amplitude square type wave between terminals 18 and 19) are each differently modulated at their front or leading edge portions of the square waves or at their shift points with respect to the modulations applied to the shift points at the rears or trailing edges of these same square type waves. Thus, each wave such as 20 or 21, may be dually modulated or differently wave width modulated at the fronts and rears of individual wave forms to thus carry at least two modulating or intelligence carrying signals per wave.

From the foregoing descriptions, it will also be apparent to those skilled in this art that various other and different circuits or applications thereof may be employed under the teachings of this invention for various purposes including those of switching or for the conversion between front and rear or width modulate, two message carrying waves and two different waves or series of pulses, as from two different sources.

It will also be apparent that this invention provides a circuit, such as binary circuit, a binary scaler, or a flip-flop, as examples, which is reliable in its operation and is simple since it requires only a few, simple, reliable, and low-cost parts such as the above described and single or common negative resistance device or diode and the pairs of resistors, capacitors and one-directional devices or rectifying diodes. All of these parts, and this entire circuit may be much reduced in size to give a high degree of miniaturization.

It will also be apparent to those skilled in this art that circuits according to this invention are capable of operating at a very high frequencies in view of the now well known capabilities of tunnel diodes and that the circuits of this invention will be sturdy and substantially immune to shocks, abuse, high operating temperatures and other adverse conditions.

It will be apparent to those skilled in this art that many other modifications and variations may be effected under the above teachings without departing from the scope of the novel concepts of this invention.

We claim as our invention:

1. A binary circuit comprising a tunnel diode having two electrodes, means including a bias source supplying a bias voltage through said two electrodes of said tunnel diode for bistability thereof, a pair of rectifying diodes, each connected to one of said electrodes of said tunnel diode, a pair of biasing, power sources, each supplying biasing voltage to one of said rectifying diodes and means to supply at least one series of pulse signals to said tunnel diode through each of said rectifying diodes.

2. A bistable, binary circuit comprising only one, common, tunnel diode having two electrodes, bias means across said tunnel diodes including a bias voltage source and two resistors each connected to one of said two electrodes, a pair of rectifying diodes, each connected to one of said electrodes, the pair of biasing power sources each including a resistor and supplying biasing voltage to one of said rectifying diodes, a pair of capacitors, and means to supply at least one series of pulse signals through said capacitors to said two rectifying diodes and to each one of said two electrodes of said tunnel diode.

3. A flip-flop comprising only one, voltage controlled device of the type having a characteristic with a negative resistance region between two regions of positive resistance, means connected across said device to bias it for bistability, two different power sources each including only one rectifier and an output, said outputs being across said device, and means to supply at least one series of controlling signal pulses through said rectifiers to said device.

4. A bistable, binary circuit comprising one common, voltage controlled diode type having a characteristic with a negative resistance region between two regions of positive resistance, means including a bias voltage source and a first resistance on each side of said diode, connected across said diode to bias it for bistability, two different power sources each including, in series, a second resistance, only one rectifier, and an output, said outputs being connected across said diode and between said diode and said first resistances, only two differentiating capacitors, each connected to one of said two power sources between said second resistances and said rectifiers, and means, including a common connection to said two condensers to supply at least one series of controlling signal pulses through said rectifiers to said bistable diode.

5. A bistable, binary circuit comprising a common device having a characteristic with a negative resistance region between two positive resistance regions, means connected across said device to bias it for bistability in one of said two positive resistance regions, two different power sources and biasing circuit means having said device connected them to control one of them by one of its said two bistable conditions, each power circuit means including a switchable, one-directional element, and means to supply controlling pulses to said common device through both of said power circuit means and their one-directional elements to switch the bistable condition of said device and to switch one of said one-directional elements.

6. A bistable, binary circuit comprising a common device having a characteristic with a negative resistance region between two positive resistance regions, means connected across said device to bias it for bistability in one of said two positive resistance regions, two different power sources and biasing circuit means having said device connected between them to control one of them by one of its said two bistable conditions, each power circuit means including a switchable, one-directional element, and means to supply controlling pulses to said common device through both of said power circuit means and their one-directional elements to switch the bistable condition of said device and to switch one of said one-directional elements, said device comprising a diode and said last named means comprising a common connection to both of said power circuit means and a source for only one signal set of pulses to modulate alternately the fronts and rears of the single, square type, wave form produced by said two power circuit means.

7. A bistable, binary circuit comprising a common device having a characteristic with a negative resistance region between two positive resistance regions, means connected across said device to bias it for bistability in one of said two positive resistance regions, two different power sources and biasing circuit means having said device connected between them to control one of them by one of its said two bistable conditions, each power circuit means including a switchable, one-directional element, and means to supply controlling pulses to said common device through both of said power circuit means and their one-directional elements to switch the bistable condition of said device and to switch one of said one-directional elements, said device comprising a diode, and said last named means comprising a common connection to both of said power circuit means and sources for two differential signal sets of pulses to alternately modulate the fronts and rears of the single, square type, wave form produced by said two power circuit means according to two different useful signals.

8. A bistable, binary circuit for converting between the dual modulation of a square type, single wave form by the different width modulations of its wave fronts and wave rears and the single phase modulations of two different pulse signals comprising a common diode having a negative resistance region between two positive resistance regions, means connected across said diode to bistably bias it for a stable point in each positive resistance region, two different, square wave type and biasing circuit means having said diode connected between them to control one of them by one of its two, bistable conditions, each biasing circuit means including a one-directional and switchable element, and circuit means for two different pulse signals connected to both of said square wave type circuit means.

No references cited.

Notice of Adverse Decision in Interference

In Interference No. 94,966 involving Patent No. 3,061,743, H. Fukui and K. Tsujii, BINARY CIRCUIT, final judgment adverse to the patentees was rendered Mar. 10, 1966, as to claims 1, 2, 3, 5, 6 and 7.

[*Official Gazette June 28, 1966.*]